United States Patent
Bang

(12) 
(10) Patent No.: US 6,373,309 B1
(45) Date of Patent: Apr. 16, 2002

(54) DUTY CYCLE COMPENSATION CIRCUIT OF DELAY LOCKED LOOP FOR RAMBUS DRAM

(75) Inventor: Jeong Ho Bang, Kyoungki-do (KR)

(73) Assignee: Hyundai Electronics Industries Co., Ltd., Kyoundi-do (KR)

( * ) Notice: Subject to any disclaimer, the term of this patent is extended or adjusted under 35 U.S.C. 154(b) by 0 days.

(21) Appl. No.: 09/735,642

(22) Filed: Dec. 14, 2000

(30) Foreign Application Priority Data

Dec. 16, 1999 (KR) ............................................ 99-58386

(51) Int. Cl.[7] ................................................ H03K 7/08
(52) U.S. Cl. ........................................ 327/175; 327/156
(58) Field of Search ........................ 327/35, 156, 158, 327/172, 175, 113, 114, 272, 277, 284

(56) References Cited

U.S. PATENT DOCUMENTS

| | | | | |
|---|---|---|---|---|
| 5,477,180 A | * | 12/1995 | Chen | ........................... 327/175 |
| 5,614,855 A | * | 3/1997 | Lee et al. | ................... 327/158 |
| 6,028,491 A | * | 2/2000 | Stanchak et al. | ........... 327/175 |
| 6,040,726 A | * | 3/2000 | Martin | ....................... 327/175 |

\* cited by examiner

*Primary Examiner*—Kenneth B. Wells
*Assistant Examiner*—Linh Nguyen
(74) *Attorney, Agent, or Firm*—Pillsbury Winthrop, LLP

(57) ABSTRACT

The present invention relates to a duty cycle compensation circuit of a delay locked loop in a Rambus DRAM. The duty cycle compensation circuit comprises a duty cycle compensation unit for compensating a duty cycle of an input signal during an operation mode other than a nap mode, and storing the duty information of the compensated input signal into a capacitor during nap mode. An analog-to-digital converter converts the compensated input signal from the duty cycle compensation circuit into a digital signal according to a first control signal, and maintains the converted digital signal regardless of the input signal when the first control signal is disabled. A digital-to- analog converter converts the digital signal from the analog-to-digital conversion unit into an analog signal according to a second signal and is turned off when the second control signal is disabled. A control unit respectively generates the first and second control signals depending on whether or not the nap mode operates.

8 Claims, 5 Drawing Sheets

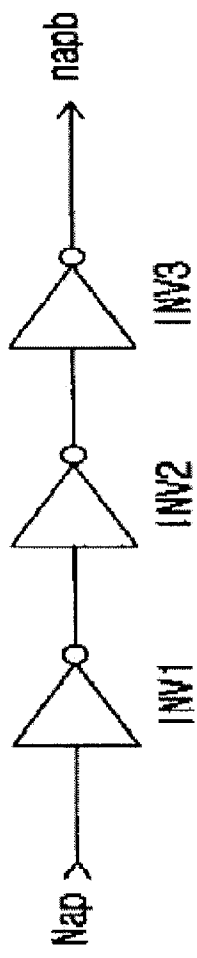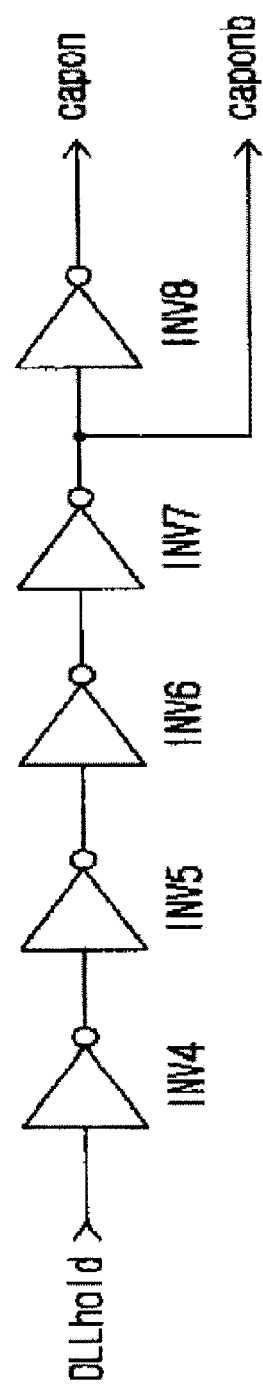
FIG. 4 (PRIOR ART)
FIG. 5 (PRIOR ART)

DUTY CYCLE COMPENSATION CIRCUIT OF DELAY LOCKED LOOP FOR RAMBUS DRAM

BACKGROUND OF THE INVENTION

1. Field of Invention

The present invention relates in general to a duty cycle compensation circuit of a delay locked loop (DLL) in a Rambus DRAM. More specifically, the inventions claimed herein feature, in part, a duty cycle compensation circuit of a delay locked loop (DLL) capable of reducing power consumption by reducing the time for escaping from a nap mode and extending the time for maintaining the nap mode. This is accomplished by safely storing information even in case of a long nap mode digitalizing an analog duty information of a clock input signal in the nap mode, and immediately using the information re-analogized from digital information of the clock signal that is stored when escaping from the nap mode.

2. Description of Related Art

A DLL circuit which is part of a system receives an externally generated clock signal input, synchronizes it with a clock signal generated within the system, and outputs it. The DLL may be applied to a cash memory unit ('SRAM' is generally used.) increasing a data process speed between the CPU of a computer and a DRAM as well as various kinds of logical devices or to a synchronous DRAM and a Rambus DRAM. The duty cycle compensation circuit used in the DLL is a circuit that compensates a duty of an inner clock used in a direct Rambus DRAM.

In general, the Rambus DRAM has various modes of operation such as, for example, active mode, standby mode, and nap mode to operate a system with low electric power drain. Rambus DRAM in operating in its active mode is ready to transmit data at any time and consumes more electric power than it does in its other modes of operation.

In a general DRAM memory system, all memory banks of respective devices consume electric power for reading/writing through the over-all access command, while in the Rambus DRAM memory system, reading/writing are performed through only one device after the other devices are converted into a state of low electric power.

Rambus DRAM is automatically changes to standby mode operation at the last step of transmission. When a request packet is decoded so as to specify the address of a particular device, the other (non-addressed) Rambus DRAMs return to the standby mode, leaving only the addressed device in a more active mode. The addressed device returns to the standby mode when the reading or writing operation ends.

In other words, Rambus DRAMs tend to return to the standby mode. Due to this default mode property, the other Rambus DRAMS remain on the standby mode while only a selected Rambus DRAM changes to active mode operation, thereby minimizing consumption of electric power.

Causing one or more Rambus DRAMs to operate in a nap mode may reduce the consumption of electric power. Nap mode operation consumes less electric power than standby mode operation. A device can change from nap mode to active mode faster than it can change from powerdown mode to active mode. Whenever the system is not reading or writing, the Rambus DRAM changes its mode of operation to nap mode thereby largely reducing the consumption of electric power. When one or more Rambus DRAMS change to power down mode, the greater effect of reduction in electric power can be obtained.

When the Rambus DRAM is in the nap mode, all bias power is off and no inner clock is generated. However, all bias power is on when escaping from the nap mode thereby generating an inner clock.

FIG. 1 shows a known circuit arrangement having a power save mode function for a Rambus DRAM. The circuit arrangement includes a packet controller 200, a power mode controller 300, a DLL 400, and a memory core 100. The packet controller 200 receives a control packet signal $ctrl_{13}$ PKT applied from the external channel of the memory and generates a control signal cntrl controlling whether the power mode is possible or not and an OP_code defining each operation mode.

The power mode controller 300 respectively generates a self refresh enable signal_self_refresh en and power mode signals (a nap mode signal Nap and a power down mode signal PDN) by combining the signals (OP_code and the cntrl) from the packet controller 200. At this time, the self-refresh enable signal self_refresh_en performs a self-refresh operation by operating the refresh counter (not shown) provided at the inside or outside of the memory core 100.

Meanwhile, the nap mode signal Nap and the power down mode signal PDN from the power mode controller 300 are transmitted to the DLL 400 thereby controlling the operation of the DLL 400 depending on each power mode.

The DLL 400 is controlled by the nap mode signal Nap and the power down mode signal PDN, receives the clock signal clk_in from the external channel, detects the phase difference between the clock signal clk_in and the clock signal used in a semiconductor memory, adjusts them so that no phase difference exists, and generates a locked signal showing the possibility to be changed to a normal operation mode by the power mode controller 300.

FIG. 2 is a block construction diagram of the DLL 400 shown in FIG. 1. DLL 400 comprises a control unit 410, a bias generation unit 420, a duty cycle compensation unit 430, a phase detection and mix unit 440, a clock amplification unit 450, and a clock buffer unit 460.

The phase detection and mix unit 440 receives the clock signal clk_in from the external channel, and outputs a signal obtained by detecting the phase difference between a clock signal clk_in from the external channel and the clock signal clk_out used in the semiconductor memory and mixing the clock signals clk_in and clk_out.

The clock amplification unit 450 amplifies the output signal from the phase detection and mix unit 440, and outputs the amplified signal to the clock buffer unit 460. The duty cycle compensation unit 430 compensates for the phase difference between the clock signal clk_in the clock signal clk_out by the PDM signal from the control unit 410, and stores duty information into a capacitor by the nap mode signal from the control unit 410. The bias generation unit 420 is operated by the nap mode signal from the control unit 410 and generates a bias signal. The control unit 410 controls the operation of each circuit by the nap mode signal Nap and the power down mode signal PDN from the power mode controller 300.

FIG. 3 is a circuit diagram of the duty cycle compensation unit 430 shown in FIG. 2. The duty cycle compensation unit 430 comprises a differential amplification stage 432 controlling output signals in the nap mode (napb signal is 'low') and respectively outputting the differentially amplified signals of the input clock signals (clki and clkib) to output nodes (Nd6 and Nd7) in the other operation modes (napb signal is 'high'), a signal transmission switching stage 434 respectively switching output signals from the differential amplification stage 432 to a first terminal as a signal dccb and a second terminal as a signal dcc, and a storage capacitor stage 436 storing the data signals dccb and dcc.

The differential amplification stage 432 is operated by a signal vbiasn from the bias generation unit 420, differentially amplifies clock signals clki and clkib when a power reset signal PwrRst is 'low', a nap mode bar signal napb is 'high', and a capacitor on signal capon is 'high', and outputs the amplified signal to the output terminals.

The detailed operation of the differential amplification stage 432 will now be described. First, when the signal vbiasn is enabled to a 'high' level, NMOS transistors N3, N4, and N5 and PMOS transistors P1 to P3 functioning as a current source are turned on thereby operating the differential amplification stage 432.

Afterwards, when the nap mode bar signal napb is 'high' level (not in the nap mode but in the other operation modes), a NMOS transistor N6 is turned on and the potential level at the node Nd5 is dropped to a ground potential level Vss through NMOS transistors N5 and N6 which are turned on. As the potential level at the node N5 goes downward the ground potential level Vss, a PMOS type diode P4 and PMOS transistors P5 to P7 having current mirror type structures are turned on.

Potential levels at nodes Nd1 and Nd2 are differentially amplified by the operations of NMOS transistors N1 and N2 that are on/off by the input signals clki and clkib. The amplified signals at the nodes Nd1 and Nd2 are transmitted to output nodes Nd6 and Nd7 of the differential amplification stage 432 through PMOS transistors P6 and P7, which are turned on. At this time, at the node Nd6 or Nd7 being 'high' level, its level is converted into 'low' level because a current path is formed to the Vss through NMOS transistors N9, N10, N15, and N16 that are turned on by the nap mode bar signal napb. At the node Nd6 or Nd7 being 'low' level, its level is converted into 'high' level by the voltage supplied through PMOS transistors P2 and P6, and PMOS transistors P3 and P7 having current mirror type structures because a current path is not formed to the Vss.

Accordingly, the differentially amplified signal is output to the nodes Nd6 and Nd7 according to the clock signal clki and clkib in an interval when the bias voltage signal Vbiasn is 'high', the nap mode bar signal napb is 'high', and the power reset signal PwrRst is 'low'.

In the meantime, since the bias voltage signal Vbiasn is 'high', the nap mode bar signal napb is 'low', and the power reset signal PwrRst is 'high' in the Nap mode operation, the NMOS transistor N6 is turned on and the PMOS transistor P8 is turned on thereby making the potential at the node Nd5 into 'high'. Consequently, the diode P4 and the current mirror type PMOS transistors P5 to P7 are off. NMOS transistors N9, N10, N15, and N16 are turned off thereby controlling the operation of the differential amplification stage 432. At this time, the output nodes Nd6 and Nd7 are equalized by a PMOS transistor P13.

The signal transmission switching stage 434 comprises transmission gates P9 and N19 transmitting the signal from the node Nd6 to the output terminal outputting the signal dccb according to the control signal capon from an input terminal and the control signal capon from other input terminal, a capacitor N21 connected between the output terminal outputting the dccb and the input terminal receiving the signal caponb, and capacitor P10 connected between the output terminal outputting the signal dccb and the other input terminal receiving the signal capon. Herein, the transmission gates P9 and N19 are comprised of PMOS and NOMS respectively, the capacitor N21 is comprised of NMOS, and the capacitor P10 is comprised of PMOS. And also the signal transmission switching stage 434 comprises transmission gates P12 and N20 transmitting the signal at the node Nd7 to the output terminal outputting the signal dcc according to the control signal capon from the input terminal and the control signal caponb from the input terminal, a capacitor N22 connected between the output terminal outputting the signal dcc and the input terminal receiving the signal capon, and capacitor P11 connected between the output terminal outputting the signal dcc and the input terminal receiving the signal capon. Herein the transmission gates P12 and N20 are comprised of PMOS and NOMS respectively, the capacitor N22 is comprised of NMOS, and the capacitor P11 is comprised of PMOS.

The signal transmission switching stage 434 switches the signal from the differential amplification stage 432 to a capacitor stage 436 connected to the output stage according to the control signals capon and caponb. Herein, the control signal capon disconnects the path between the output terminals Nd6 and Nd7 of the differential amplification stage 432 and the output terminals outputting the signals dcc and dccb since the control signal capon is 'low' in the nap mode (the signal napb is 'low'), while the control signal capon transmits duty information of the input signals clki and clkib from the differential amplification stage 432 to the output terminals since the control signal is 'high' in the other operation modes(the napb signal is 'high').

The storage capacitor stage 436 comprises NMOS type capacitors N23 and N24 that are respectively connected between the output terminals and the ground Vss. The NMOS type capacitors N23 and N24 store duty information to be output to the output terminals in the nap mode for a predetermined time.

FIG. 4 shows a circuit for generating the control signal napb shown in FIG. 3. The circuit comprises three inverters INV1, INV2 and INV3 connected in series. The inverter INV1 receives the signal Nap, and the inverter INV3 outputs the signal napb. Herein the nap mode bar signal napb has low level in the nap mode.

FIG. 5 shows a circuit for respectively generating the control signals capon and caponb as shown in FIG. 3 using a the hold signal DLLhold from DLL. The circuit for generating the control signals capon and caponb comprises four inverters INV4 to INV7 connected in series between a terminal receiving the signal 'DLLhold' and a terminal outputting the control signal caponb, and an inverter INV8 connected between the terminal outputting the control signal caponb and the terminal outputting the control signal capon.

The control signal capon is 'low' and the control signal caponb is 'high' in the Nap mode (the napb is 'low').

The duty cycle compensation unit 430 in the DLL 400 as shown in FIG. 3 stores duty information in the capacitor of the output stage when the Rambus DRAM is in the Nap mode, and uses the information in the normal operation. However the conventional duty cycle compensation unit having such a construction may lose the stored duty information due to leakage current generated in the capacitor in case the operation time of the nap mode is long. Due to this, it is further required the time necessary for compensating the information lost when escaping from the nap mode. Consequently, the consumption of the power is increased and the escape time is very long.

SUMMARY

The inventions claimed herein feature, at least in one respect a duty cycle compensation circuit of a delay locked loop (DLL) capable of reducing power consumption by reducing the time necessary for escaping from a nap mode and extending the time for maintaining the nap mode. The DLL for Rambus DRAM according to the present invention comprises: a duty cycle compensation arrangement that compensates a duty cycle of an input signal in modes of operation other than nap mode, and stores the duty information of the compensated input signal into a capacitor in the nap mode. An analog-to-digital converter arrangement converts the compensated input signal from the duty cycle compensation arrangement into a digital signal according to a first control signal, and maintains the converted digital signal regardless of the input signal when the first control signal is disabled. A digital-to-analog converter converts the digital signal from the analog-to-digital converter arrangement into an analog signal according to a second control signal, and being turned off when the second control signal is disable; and a control means for respectively generating the first and second control signals depending on whether or not the nap mode operates.

In the duty cycle compensation circuit of the DLL for the Rambus DRAM according to the present invention, the control means disables the first and second control signals in the other operation modes than the nap mode, enables the first control signal in the nap mode, and enables the second control signal in escaping from the Nap mode.

The control means disables the first control signal when the conversion from the analog signal to digital signal is completed. The control means disables the second control signal when the conversion from the digital signal to analog signal is completed.

BRIEF DESCRIPTION OF THE DRAWINGS

FIG. 4 is a circuit for generating the control signal 'napb' shown in FIG. 3.

FIG. 5 is a circuit for generating the control signals 'capon' and 'caponb' used in FIG.3.

DETAILED DESCRIPTION

Figure 1:
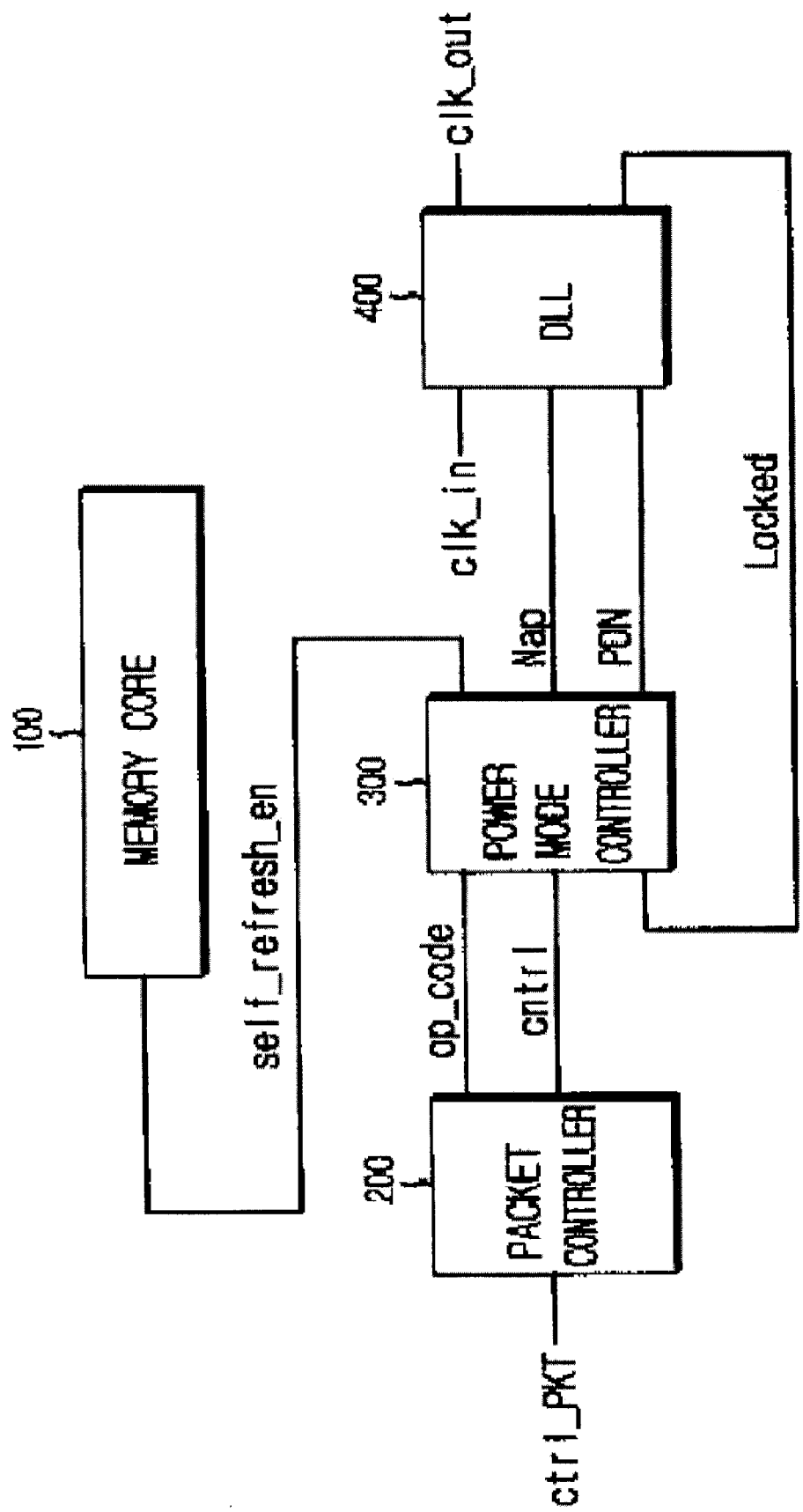
FIG. 1 is a block diagram of a conventional Rambus DRAM.
Figure 2:
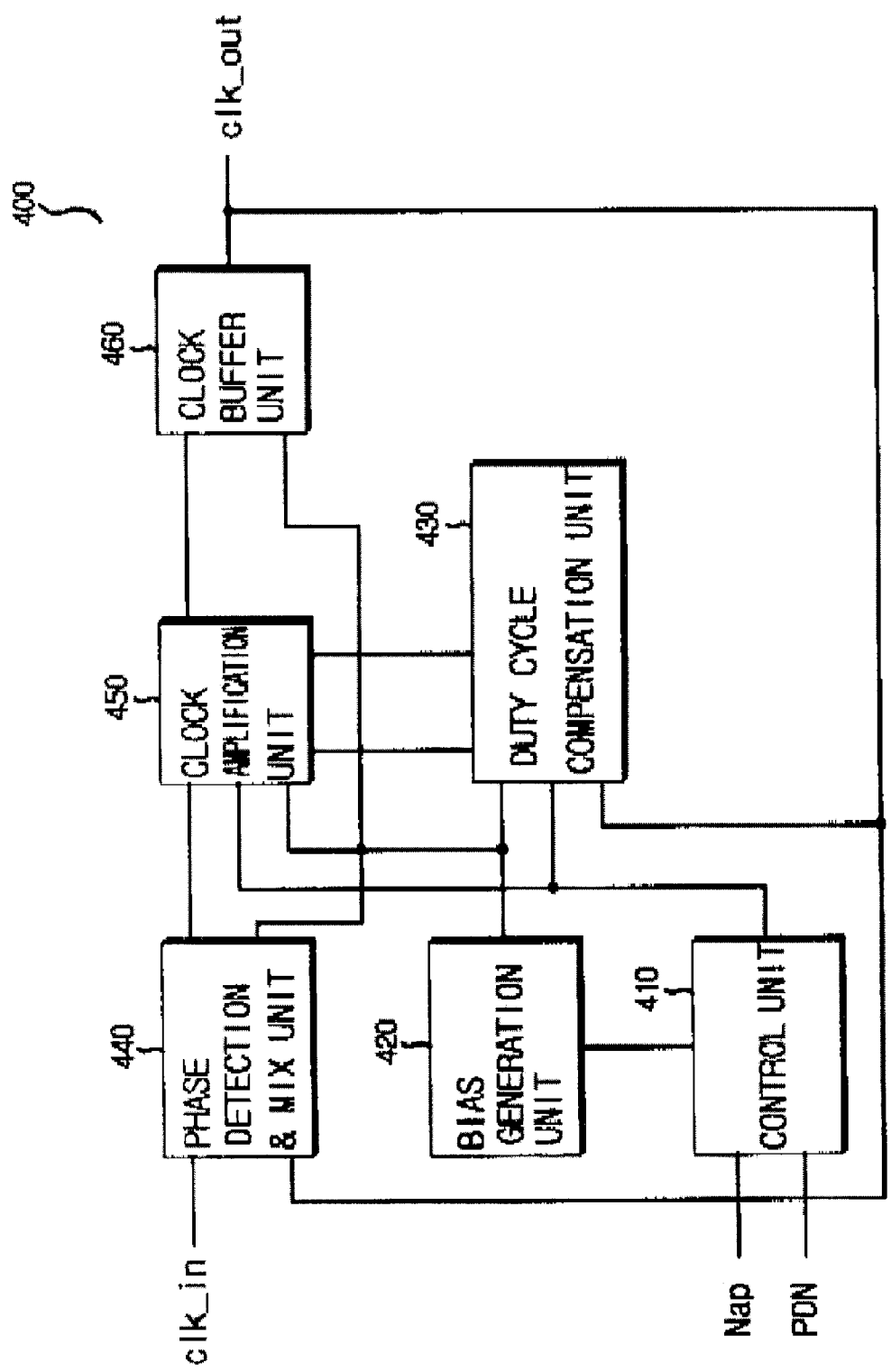
FIG. 2 is a block diagram of the DLL shown in FIG. 1.
Figure 3:
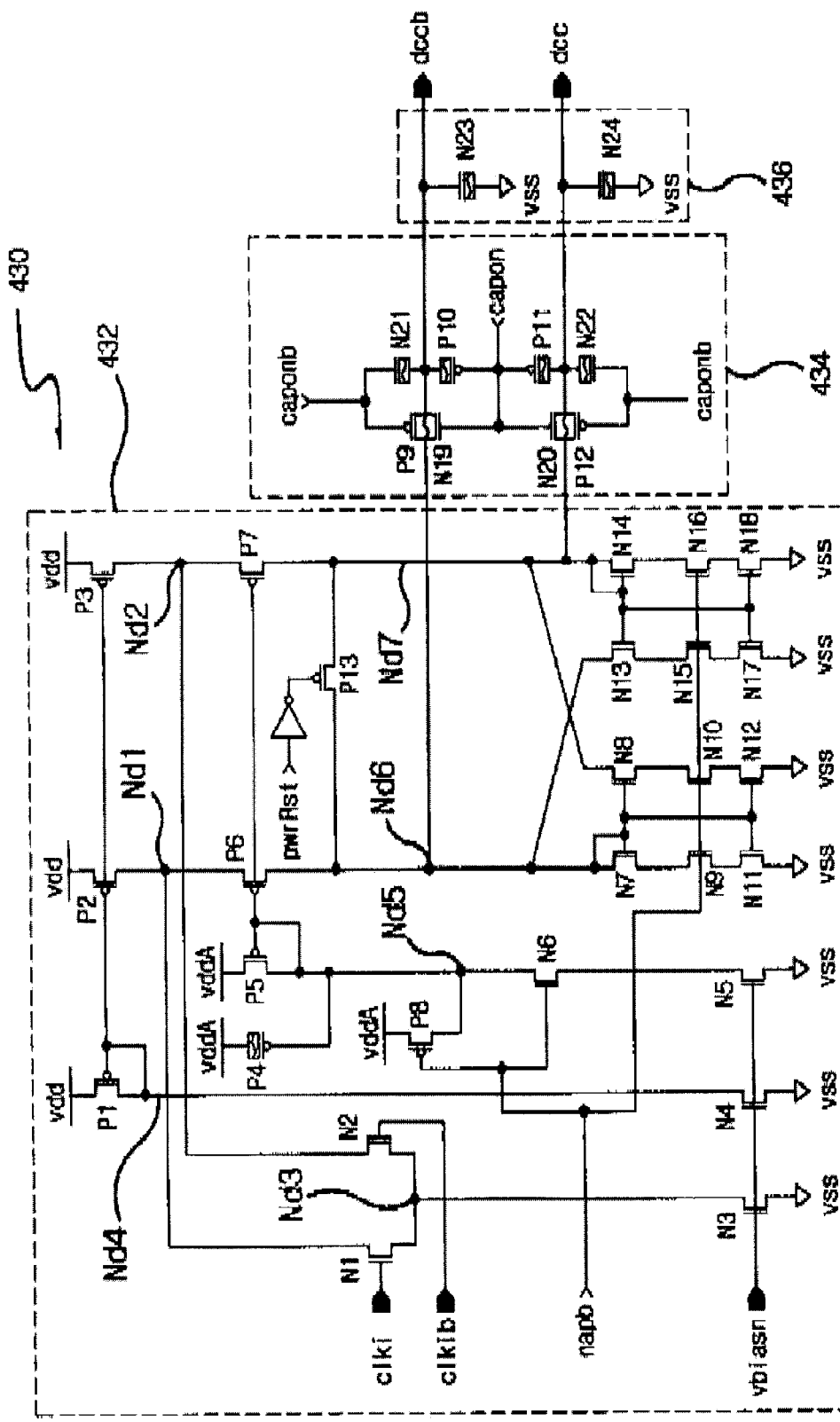
FIG. 3 is a duty cycle compensation circuit of a DLL according to a prior art.

Hereinafter, exemplary embodiments of the present invention will be described in detail with reference to the attached drawings. Elements or parts having identical or similar functions will be described with reference to the same reference numerals and the detailed description of the functions will be omitted.

Figure 6:
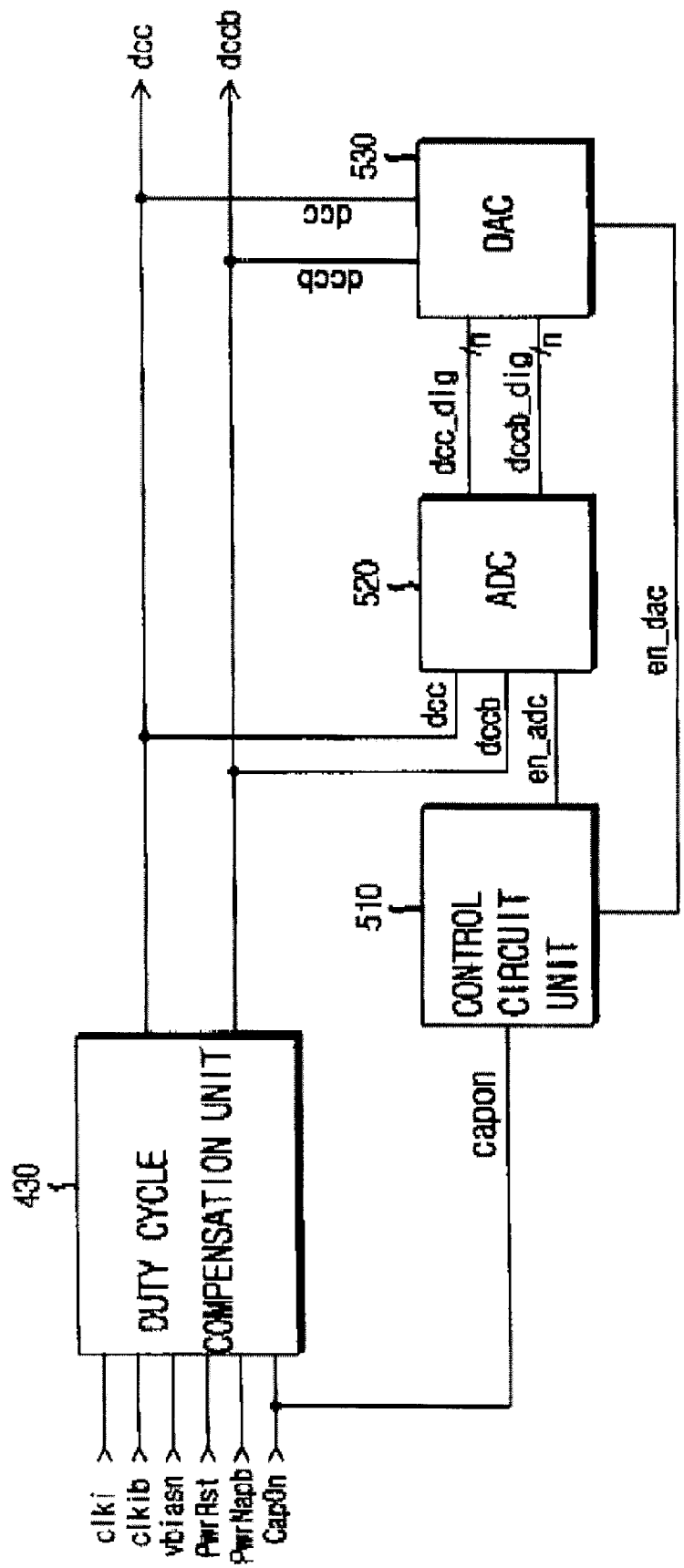
FIG. 6 is a block diagram of the duty cycle compensation circuit of the DLL according to the present invention.

FIG. 6 is the block diagram of the duty cycle compensation circuit of the DLL according to the present invention, comprising a duty cycle compensation unit 430, a control circuit unit 510, an analog-to-digital conversion (ADC) unit 520, and a digital-to-analog conversion (DAC) unit 530.

The duty cycle compensation unit 430 compensates duty of input analog signals clki and clkib and transmits them to output as analog signals 'dcc' and 'dccb' when the bias voltage signal Vbiasn is 'high', the power reset signal PwrRst is 'low', the nap mode bar signal PwrNapb is 'high', and the control signal capon is 'high'. At this time, the 'clki' is output as the 'dcc', and the 'clkib' is output as the 'dccb'.

Duty cycle compensation unit 430 stores the compensated duty signals 'dcc' and 'dccb' of the input signals into the capacitor in the nap mode (the napb is 'low'.), compensates the duty of the input signals 'clki' and 'clkib', and respectively outputs them as the output signals 'dcc' and 'dccb' in the other operation modes (the napb is 'high').

Control circuit unit 510 disables an enable signal en_adc to be input to the ADC 520 and an enable signal en_dac to be input to the DAC 530 when the control signal 'capon' is 'high', and activates the enable signal en_adc when the control signal 'capon' is changed from 'high' to 'low'. Also, the control circuit unit 510 disables the enable signal en_adc when the ADC 520 converts the input analog signals dcc and dccb into the digital signals dcc_dig and dccb_dig.

Control circuit unit 510 activates the enable signal en_dac when the control signal 'capon' is changed from 'low' to 'high'. And, the control circuit unit 510 disables the enable signal en_dac when the DAC 530 converts the input digital signals dcc_dig and dcc_dig into the analog signals.

ADC 520 receives the analog signals dcc and dccb from the duty cycle compensation circuit unit 430 when the enable signal en_adc is applied thereto, converts them into the digital signals dcc_dig and dccb_dig, and maintains the converted signals regardless of in input signals when the enable signal en_adc is disabled.

DAC 530 receives the digital signals dcc_dig and dccb_dig generated from the ADC 520 when the enable signal en_dac from the control circuit unit 510 is applied thereto, converts them into the analog signals dcc and dccb, and is turned off regardless of the input signals when the enable en_adc is disabled.

As described above, the duty cycle compensation circuit of the DLL for the Rambus DRAM constructed and arranged according to the present invention reduces power consumption with respect to known arrangements by reducing the time necessary for escaping from a nap mode and extending the time for maintaining the nap mode. Power consumption reduction is safely accomplished by storing, even in the case of a long nap mode, digitized information corresponding to analog duty information of a clock input in the nap mode, immediately using the information re-converted into analog form from the digital information of the clock that are stored when escaping from the nap mode.

Although the preferred embodiments of the present invention have been disclosed for illustrative purposes, those skilled in the art will appreciate that various modifications, additions and substitutions are possible, without departing from the scope and spirit of the present invention as disclosed in the accompanying claims.

What is claimed is:

1. A duty cycle compensation circuit of a delay locked loop (DLL) for a Rambus DRAM comprising:

a duty cycle compensation means for compensating a duty cycle of an input signal during modes of operation other than a nap mode and providing a compensated input signal, and storing duty information of a compensated input signal into a capacitor so that the information will be stored during nap mode operation;

an analog-to-digital conversion means for converting the compensated input signal into a digital signal according to a first control signal, and maintaining the converted digital signal regardless of the input signal when the first control signal is disabled;

a digital-to-analog conversion means for converting the digital signal from the analog-to-digital conversion means into an analog signal according to a second control signal, and being turned off when the second control signal is disable; and a control means for respectively generating the first and second control signals depending on whether or not the nap mode operates.

2. A circuit according to claim 1, wherein the control means disables the first and second control signals during operation modes other than nap mode, enables the first control signal during nap mode, and enables the second control signal when escaping from nap mode.

3. A circuit according to claim 1, wherein the control means disables the first control signal when the conversion from the analog signal to the digital signal is completed.

4. A circuit according to claim 1, wherein the control means disables the second control signal when the conversion from the digital signal to the analog signal is completed.

5. A duty cycle compensation circuit of a delay locked loop for a Rambus DRAM comprising:

a duty cycle compensation circuit arrangement constructed and arranged to compensate a duty cycle of an input signal during modes of operation other than a nap mode, and storing duty information of a compensated input signal into a capacitor during nap mode operation;

an analog-to-digital converter constructed and arranged to convert the compensated input signal from the duty cycle compensation circuit arrangement into a digital signal according to a first control signal, and maintain the converted digital signal regardless of the input signal when the first control signal is disabled;

a digital-to-analog converter constructed and arranged to convert the digital signal from the analog-to-digital converter into an analog signal according to a second control signal, and be turned off when the second control signal is disabled; and a control circuit constructed and arranged so as to respectively generate the first and second control signals depending on whether or not the nap mode operates.

6. A circuit of the DLL according to claim 5, wherein the control circuit disables the first and second control signals in the other operation modes than the nap mode, enables the first control signal in the nap mode, and enables the second control signal in escaping from the nap mode.

7. A circuit according to claim 5, wherein the control circuit disables the first control signal when the conversion from the analog signal to the digital signal is completed.

8. A circuit according to claim 5, wherein the control circuit disables the second control signal when the conversion from the digital signal to the analog signal is completed.

* * * * *